United States Patent [19]
Gorrell et al.

[11] Patent Number: 5,786,270
[45] Date of Patent: Jul. 28, 1998

[54] METHOD OF FORMING RAISED METALLIC CONTACTS ON ELECTRICAL CIRCUITS FOR PERMANENT BONDING

[75] Inventors: Robin E. Gorrell; Paul J. Fischer, both of Eau Claire, Wis.

[73] Assignee: W. L. Gore & Associates, Inc., Newark, Del.

[21] Appl. No.: 744,842

[22] Filed: Nov. 8, 1996

Related U.S. Application Data

[63] Continuation-in-part of Ser. No. 655,017, May 29, 1996.
[51] Int. Cl.$^6$ .................... H01L 21/44; H01L 21/463
[52] U.S. Cl. .................... 438/613; 438/612; 438/614; 438/977
[58] Field of Search .................... 438/613, 625, 438/669, 672, 667, 737, 612, 614, 687, 977

[56] References Cited

U.S. PATENT DOCUMENTS

| | | | |
|---|---|---|---|
| 3,319,317 | 5/1967 | Roche et al. | 29/155.5 |
| 4,116,517 | 9/1978 | Selvin et al. | |
| 4,125,310 | 11/1978 | Reardon, II et al. | |
| 4,453,795 | 6/1984 | Moulin | |
| 4,717,066 | 1/1988 | Goldenberg et al. | |
| 4,764,485 | 8/1988 | Loughran et al. | |
| 4,963,225 | 10/1990 | Lehman-Lamer | |
| 5,072,520 | 12/1991 | Nelson | 29/852 |
| 5,197,184 | 3/1993 | Crumly et al. | |
| 5,211,577 | 5/1993 | Daugherty | |
| 5,326,412 | 7/1994 | Schreiber et al. | 156/150 |
| 5,492,863 | 2/1996 | Higgins, III | 438/699 |

OTHER PUBLICATIONS

Van Nostrand Reinhold "Microelectronics Packaging Handbook" 1989, pp. 366–369, edited by Tummala et al.

*Primary Examiner*—Caridad Everhart
*Attorney, Agent, or Firm*—Victor M. Genco, Jr.

[57] ABSTRACT

A method is provided for forming at least one raised metallic contact on an electrical circuit for permanent bonding. Generally, this method includes the following steps: providing a composite base substrate which is defined by at least a first conductive layer, a dielectric material and a second conductive layer; removing a portion of the first conductive layer to expose the dielectric material; removing the exposed portion of the dielectric material to the second conductive layer, thereby forming a depression; depositing at least one layer of solder on at least side wall portions of the depression; depositing at least one layer of copper; removing the second conductive layer; and completely removing the dielectric material to said first conductive layer thereby forming a raised solder contact which extends perpendicularly away from the first conductive layer.

7 Claims, 7 Drawing Sheets

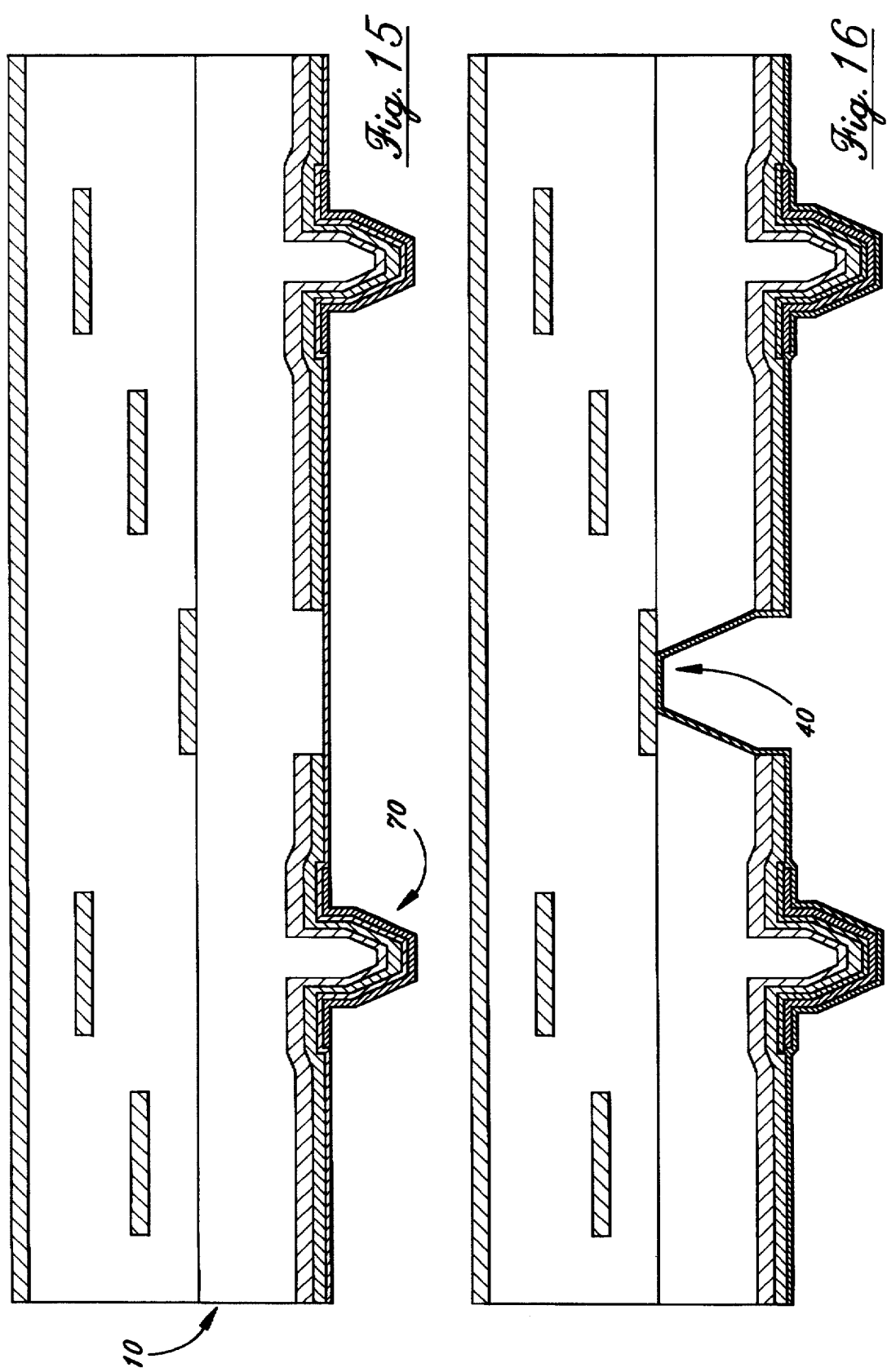

METHOD OF FORMING RAISED METALLIC CONTACTS ON ELECTRICAL CIRCUITS FOR PERMANENT BONDING

CROSS-REFERENCE TO RELATED APPLICATIONS

This application is a continuation-in-part of application Ser. No. 08/655,017, filed May 29, 1996, pending.

FIELD OF THE INVENTION

The present invention generally relates to the manufacture of electrical circuitry with features having a three-dimensional configuration that extends in one or more directions from a plane of the circuit.

BACKGROUND OF THE INVENTION

Both flexible and rigid printed circuits are connected to similar circuits and other components by means of various types of connecting devices. Flat, flexible printed circuit connecting cables warrant use of similarly configured connecting devices and have been developed to a point where connection between one such printed circuit cable and another circuit is made by providing a plurality of projecting metallic interconnection features that may be pressed against either similar features or mating metallic connecting pads on the other circuit component or components. Flexible circuit terminations or connecting wafers of this type are described in U.S. Pat. Nos. 4,125,310, 4,116,517; and U.S. Pat. No. 4,453,795.

The connectors of these patents embody a substrate having traces chemically milled thereon with a plurality of metallic raised features later formed to project from the plane of the circuit conductors. Thus, when two such connectors are placed face to face, with the raised features of one in registration and contact with the other, the planes of the etched electrical circuits are suitably spaced from one another because of the projection of the features. The two circuits may be physically clamped together to press the features against one another, thereby making firm and intimate electrical contact between the two circuits.

Although such termination arrangements are effective and reliable in operation, they are difficult, costly and time consuming to manufacture. Manufacturing difficulties associated with such connectors derive from the fact that the projecting contact buttons must be fabricated separately from (either before or after) the fabrication of the circuitry itself. More particularly, after drilling appropriate interconnection and tooling holes through a copper clad dielectric core or substrate and plating through some of the holes to interconnect circuitry on the two sides of the core, the core is placed between the circuit artwork (optical masks). The holes in the artwork or datum points are then manually aligned with the predrilled holes in the core. Where dozens of parts may be made on a single panel that is 12"×18", and alignment tolerances are measured within a few microns, registration of all or even most holes in all of the parts is exceedingly difficult, time consuming and often times not possible because of changes in dimensions of the panels that occur during some of the processing. After registration of the artwork, the substantially planar circuitry is chemically milled or etched on the copper surfaces (the panel may often be covered with a coating of copper on both sides for a double sided panel).

The etching process involves application of photoresist, masking the resist, exposing the resist, developing the resist, then etching through the portions of the copper not protected by the resist so that upon stripping of the remaining resist, the circuit pattern of the copper conductors remains.

Where raised interconnection features are employed as in flexible circuit termination wafers, it is then necessary to plate the projecting contact features on pads formed in the circuitry which has been previously etched. These features must be precisely registered with the selected pads and with the datum of the panel. However, the panels have been previously processed to form the circuit traces so that further stresses occurring in such processing effect changes in dimension (usually, but not always, shrinkage). The changing dimensions cause severe registration problems. To manufacture the projecting contact features (sometimes called "bumps"), the etched circuit is coated with a resist. Again, the appropriate artwork for defining the desired hole in the resist at the bump location must be carefully registered, which is now an even more difficult task.

In some cases, the projecting interconnection features or bumps may be formed first, before the remainder of the etched circuit is formed. But, in any event, the feature must be formed separately, at a different time than the time of forming the etched circuitry, and thus the registration problems are created or exacerbated.

In such circuits, where a connection must be made from circuitry on one side of the core to circuitry on the other side of the core, holes are drilled and through-hole plated, requiring still further steps and creating other registration problems that increase the cost and time of manufacture.

U.S. Pat. No. 5,197,184 teaches a method of additively forming three-dimensional electrical circuitry having raised contact buttons without employing circuit etching processes. The three-dimensional electrical circuitry is made by fully additive processes employing a circuit mandrel. The mandrel comprises a substrate having a working surface formed of a material on which can be electroformed an electrically conductive element, with the mandrel having a first feature projecting in directions perpendicular to the working surface to enable a three-dimensional electrical circuit to be formed by a single electroforming operation. The mandrel bears a pattern formed of electrically non-conductive material. Thus, the entire three-dimensional circuitry of traces and raised interconnection features may be electrodeposited in a single step, all without any photolithographic or etching processes. A final step in such a method includes separating the substrate and the circuitry from the mandrel to provide a dielectric substrate having a pattern of circuit traces thereon, including rigid projecting conductive contact buttons configured and arranged to be pressed against contact of another electrical circuit. Although such a method may be employed successfully, in certain situations, this method is replete with shortcomings which detract from its usefulness.

More particularly, the final process step in the method described in U.S. Pat. No. 5,197,184 requires the mechanical separation of the substrate and the circuitry from the mandrel. This separation process may be difficult to accomplish without imparting physical damage to the substrate and the circuitry. The stresses imparted to the substrate and the circuitry during this separation may be large enough to cause a change in the dimensions of the substrate. This dimensional change may result in the inability to align all of the bumps on the substrate to their opposing pads on the mating circuit.

Another shortcoming of the method described in U.S. Pat. No. 5,197,184 is that the adhesion of the circuit traces and features to the dielectric must be much greater than the adhesion of the circuit traces to the mandrel in order to insure that the traces remain in the dielectric during the process of separation from the mandrel. If the adhesion of the traces to the dielectric is less than, or only marginally equal to, the adhesion of the traces to the mandrel, some or all of the traces will remain adhered to the mandrel, resulting in a scrapped circuit.

Yet another shortcoming of the method described in U.S. Pat. No. 5,197,184 is that the process whereby the depressions are chemically etched into the mandrel may be inconsistent across the surface of a large panel, such as a 12"×18" panel. The inconsistent etching may result in variation in the depth of the depressions formed, and thus variation in the height of the bumps on the finished circuit. The nonplanarity of the bumps may cause open circuits upon clamping of the finished circuit to its opposing circuit.

A further shortcoming of the method described in U.S. Pat. No. 5,197,184 is that the final shape, and particularly the height of the bumps, is completely dependent upon the chemical etching process. Control of the height of the bumps must be determined by the size of the base of the bumps. If bumps of significant height are required, the base must be made large, thus limiting the density of the bump pattern.

The foregoing illustrates limitations in the present methods for forming three dimensional circuitry. Thus, that it would be advantageous to provide an improved method of forming three-dimensional circuitry directed to overcoming one or more of the limitations set forth above. Accordingly, a suitable alternative is provided including features more fully disclosed hereinafter.

In addition to the above applications where a flexible or multilayer circuit with raised metallic contacts may be pressed against other components, these raised metallic contacts may be required in applications where the raised metallic contact is permanently bonded to other components. Such applications are generally referred to as "flip chip" attachment and are described in *Microelectronics Packaging Handbook*, edited by Tummala et al., (Van Nostrand Reinhold: 1939); pp. 366–369.

Flip chip attachment offers advantages over the more commonly used wirebonding method, where pads placed on the periphery of the chip are attached to corresponding pads on a substrate with a gold or aluminum wire. The primary advantage of flip chip attachment is the reduced inductance achieved by eliminating the relatively long length of gold or aluminum wire. Most flip chip applications today use 4 to 6 mil diameter solder balls on a pitch of 9 or 10 mills, with 3 or more rows around the periphery of the chip. Wirebonded chips with equivalent input/output (I/O) require pad pitches on the order of 4 mils, in one row on the periphery of the chip.

In the flip chip attachment process, solder balls are formed on the pads of an integrated circuit chip by various methods, including screening through a stencil and reflowing solder paste, electroplating, evaporation, or through solder attachment of preformed solder balls of a higher melting point alloy. The pads on the chip are generally placed on a few rows around the periphery of the chip, but may form an array across the entire chip. After the solder balls are formed on the chip, the chip is flipped over and aligned to matching pads on the substrate to which the chip is to be attached, and the solder is again reflowed to complete the attachment.

Alternative methods of attachment have been devised which involve the formation of gold bumps on the chips by plating or by wirebonding and coining what are generally referred to as "ball bumps". A conductive adhesive is then used to form the connection to the substrate. Heat, pressure, and ultrasonic energy may be used instead of the conductive adhesive to form a gold bond to the chip.

The nature of the flip chip attach process requires that the solder or gold bumps be of very consistent height in order to achieve electrical contact to every pad. It can be difficult to form bumps of consistent height with many of the methods described above, particularly for the smaller solder bumps required when bonding high density chips where the pads are placed close together.

SUMMARY OF THE INVENTION

The present invention advances the art of forming three-dimensional metallic contacts, or bumps, on an electrical circuit, beyond which is known to date. More specifically, the present invention may be adapted to flip chip attachment by any of several possible methods, each involving attachment of a chip without bumps to a substrate with raised contacts.

In one aspect of the present invention the method comprises the following steps:

providing a composite base substrate which is defined by at least a first conductive layer, a dielectric material and a second conductive layer;

removing a portion of the first conductive layer to expose the dielectric material;

removing said exposed portion of the dielectric material to the second conductive layer, thereby forming a depression;

depositing at least one layer of solder material on at least side wall portions of said depression;

depositing at least one layer of conductive material on said solder layer;

removing said second conductive layer; and completely removing said dielectric material to said first conductive layer thereby forming a raised metallic contact which extends perpendicularly away from said first conductive layer.

At least a second dielectric material may be laminated to a first planar surface of said composite base substrate. At least a third conductive layer may be laminated to the second dielectric material. The third conductive layer may be electrically connected to the first conductive layer. The composite base substrate may be laminated to a printed circuit board.

It is, therefore, a purpose of the present invention to describe a method whereby raised metallic contacts may be formed on an electrical circuit without requiring the mechanical separation of the circuit from a mandrel, and thus, avoiding the shortcomings inherent in such a mechanical separation process. It is a further purpose of the present invention to provide an improved method of achieving bumps or contacts of a controllable and consistent height. It is also a purpose of the present invention to provide a thin, controllable amount of solder which is plated on a raised metallic contact or bump.

BRIEF DESCRIPTION OF THE DRAWINGS

The foregoing summary, as well as the following detailed description of a preferred embodiment of the invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings:

FIGS. 13-18 illustrate alternative process steps of the present invention, wherein the base substrate with raised metallic contacts is laminated to and electrically connected to a multilayer circuit board.

DETAILED DESCRIPTION OF THE INVENTION

Figure 1:
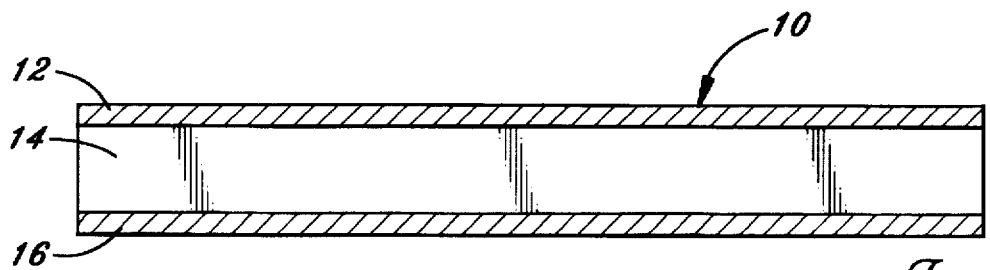
FIG. 1 is an illustration of a conductor/dielectric/conductor organic substrate used in printed circuit and flexible circuit manufacture.

In one method, solder may be applied to previously formed raised contacts by any of the methods described above. A method whereby the solder is electroplated as an integral part of the contact during its formation may have particular advantage, and will be described below. A chip, absent of solder bumps but having pads of an appropriate metallurgy, may then be aligned to the substrate having the solder coated contacts and reflowed to complete the attachment.

Another possible method would involve a substrate having contacts of copper/nickel/gold metallurgy mated to a chip coated with a non-conductive dielectric material having recesses formed over the pads of the chip, these recesses being filled with solder or with a conductive adhesive. The solder would be reflowed or the adhesive cured to form the attachment.

Yet another method may involve a substrate having contacts plated with thick, high-purity soft gold. The chip to be attached is plated with similar thick, soft gold as appropriate for TAB bonding. The chip is aligned to the substrate and heat, pressure, and ultrasonic energy are applied to result in a gold to gold bond.

In those applications involving solder on the raised contact, the amount of solder applied will limit the density of the chips which may be attached. If too much solder is formed on the contact the solder may wick to the next contact, causing a short circuit. A method whereby a thin, controllable amount of solder is plated on the contacts during their formation is described below. This method may allow an increase in density over existing flip chip applications. It may also allow chips which are currently laid out for wirebonding and having a dense peripheral pad pitch to be flip chip bonded. The chip manufacturer need only change the pad metallurgy to allow the chip to be flip chip attached, without the need to redesign the chip to add multiple peripheral rows at a 9 or 10 mil pad pitch.

The method will be described for a two layer circuit, but it may also be readily adapted to the multilayer circuit as described previously.

Referring now to the drawings, wherein similar reference characters designate corresponding parts throughout the several views, FIGS. 1-16 illustrate a process for forming raised metallic contacts, or bumps, on electrical circuits. As may be appreciated by one skilled in the art, although FIGS. 1-16 depict a process for forming raised metallic contacts on a two layer electrical circuit, any number of circuit layers may be formed utilizing the teachings of the present invention.

As best illustrated by FIG. 1, a base substrate 10 is provided which is defined by a laminate comprised of a conductive layer 12 (such as copper, for example), a dielectric layer 14, and a conductive layer 16 (such as copper, for example). The dielectric layer 14 must not comprise a material which is resistant to etching by a laser or plasma process, such as a glass reinforced dielectric layer. Suitable dielectric materials include, but are not limited to polyimides and polyamide laminates, epoxy resins, organic materials, or dielectric materials comprised at least in part of polytetrafluoroethylene. A preferred dielectric material may be obtained from W. L. Gore & Associates, Inc. under the tradename SPEEDBOARD® dielectric materials.

The thickness of the dielectric layer 14 is important. This thickness will define the height of the resulting raised metallic contacts which are formed by the teachings herein. Additional detail on the significance of dielectric layer 14 will be described below.

Figure 2:
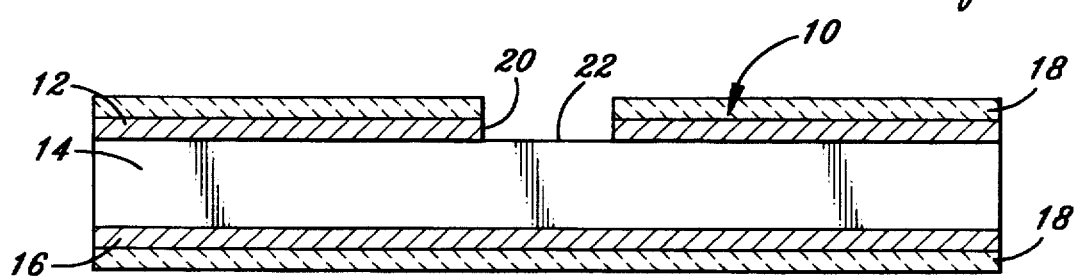
FIG. 2 illustrates a top conductor layer which has been removed by a photoresist process.

Photoresist 18 is applied to copper layers 12 and 16, respectively, and is processed in a conventional manner to form openings on copper layer 12 where the raised metallic contacts are to be formed. The copper in an exposed area 20 is etched away by any suitable conventional copper etchant, such as a cupric chloride based etchant solution. FIG. 2 illustrates the base substrate 10 after the copper within the exposed area 20 has been etched away. An exposed portion 22 of dielectric layer 14 is shown. The photoresist 18 may then be removed from the substrate.

Figure 3:
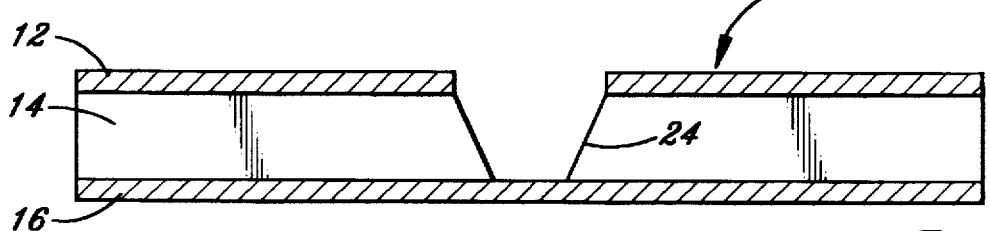
FIG. 3 illustrates a laser defined "well"

The exposed dielectric portion 22 is ablated away with a laser to define a "well" 24 into which a metallic contact will be formed, as shown in FIG. 3. As should be understood, the copper layer 12 functions as a mask to permit ablation of the exposed dielectric portion 22. The copper layer 16 acts as a stop and will define the bottom of the well 24.

The ablation of the exposed dielectric portion 22 may be accomplished by any laser suitable for selective ablation of organic dielectrics, without removing a copper layer. Lasers which operate in ultra violet wavelengths are particularly well suited, such as excimer lasers, and frequency tripled or quadrupled YAG lasers. However, other types of lasers are also suitable. The laser may be operated either in a scanning mode, in which the surface of the substrate is swept with a large laser spot, or in a focused beam. In addition to laser ablation of the exposed dielectric portion 22, other processes may be employed to selectively remove the exposed dielectric portion 22, such as but not limited to plasma etching, reactive ion etching, or chemical etching. However, a laser ablation process is particularly well suited, as it permits more control over the shape of the well 24. Simple diffraction will provide a tapered conical shape in the case of scanning mode laser ablation process.

Figure 4:
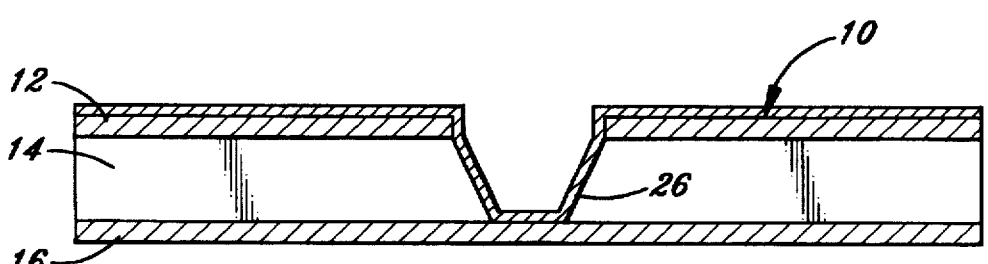
FIG. 4 illustrates an electroless and electrolytic conductor deposit over the substrate and into the side walls and base of the "well"

After the well 24 has been defined, the base substrate 10 is processed in any suitable manner which deposits a surface conductive layer 26, such as copper, on the side walls of the well 24. Suitable processes include, but are not limited to a conventional electroless copper plating operation, sputtering, evaporation, or deposition of a conductive coating which allows direct electrodeposition, or any other suitable process. Additional electrolytically deposited copper may be added to thicken this deposit, thereby providing a more robust surface for additional process steps. FIG. 4 illustrates the base substrate 10 after this conductive deposition step.

Figure 5:
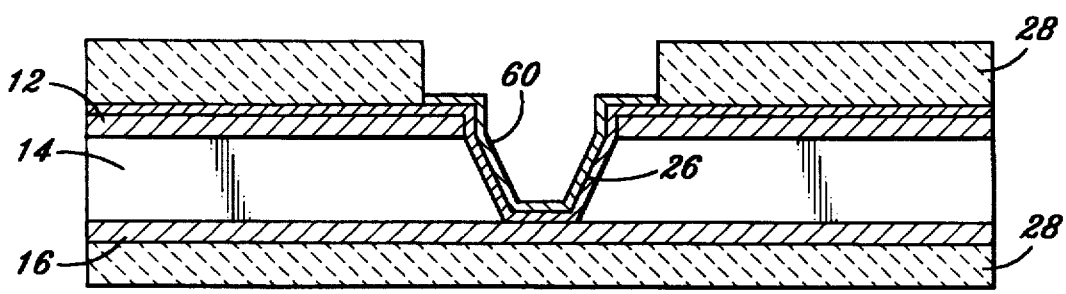
FIG. 5 illustrates the base substrate with a solder layer deposited in the well.

The base substrate is then coated with photoresist 28 on both sides of the base substrate, and the photoresist is processed to define patterns on conductive layer 12, into which solder 60 is deposited to simultaneously form at least one metal "bump" contact. Suitable types of solder include eutectic solder having a ratio of tin to lead of approximately 63/37% and having a melting point of about 180–185 degrees C. FIG. 5 illustrates a substrate with the metals deposited as described.

Figure 6:
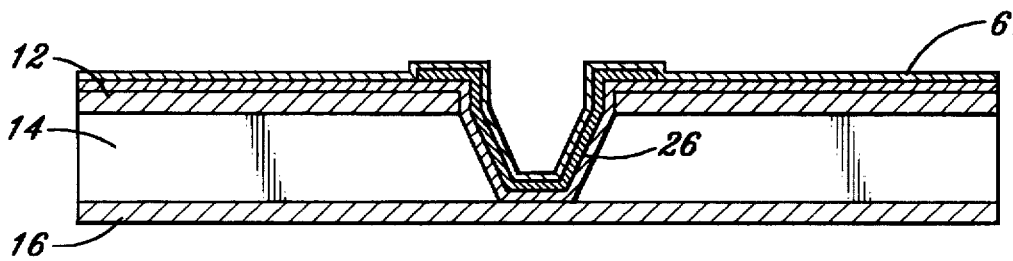
FIG. 6 illustrates how an additional thin layer of copper is applied onto the substrate to form a second layer of circuitry.

As seen by reference to FIG. 6, after deposition is complete, the photoresist 28 is removed from the base substrate 10. The base substrate 10 is then coated with an additional thin layer of copper 61 which is applied by sputtering or evaporation. The purpose of this copper layer is to allow additional plating over the solder deposit 60, which is normally oxidized and difficult to electroplate.

Figure 7:
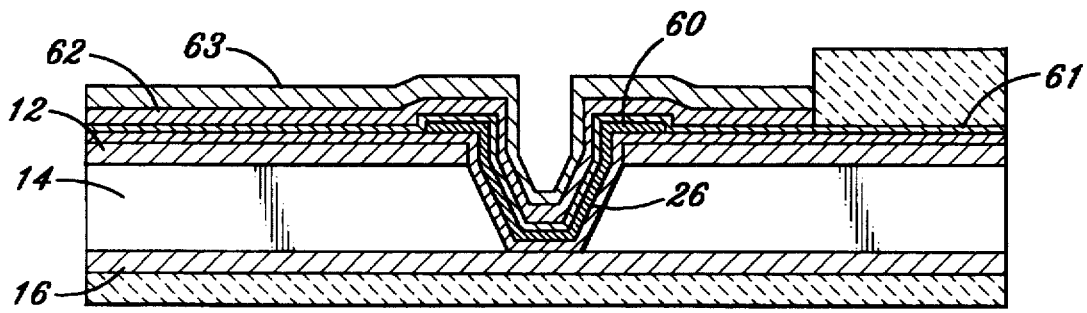
FIG. 7 illustrates an additional layer deposited on the base substrate.

The base substrate 10 is then coated with photoresist 28 on both sides, and the photoresist is processed to define patters on conductive layer 12, into which additional metal is deposited to simultaneously form the contact and the traces of the electric circuit. The pad around the contact would most often extend beyond the region into which solder 60 was deposited. A layer of nickel 62 or other metal, which would resist the flow of molten solder, is then deposited. Thereafter, a layer of copper 63, which will comprise the bulk of the metal, is then deposited. FIG. 7 illustrates substrate with the metals deposited as described.

After deposition is complete, the photoresist 28 is removed from the base substrate 10. The base substrate 10 may then be treated in a conventional oxide process, such as is common in the production of printed circuits. The rough oxide formed on the surface of the exposed copper of the base substrate will serve to provide adequate adhesion of the metal to a dielectric material in subsequent lamination processes.

Figure 8:
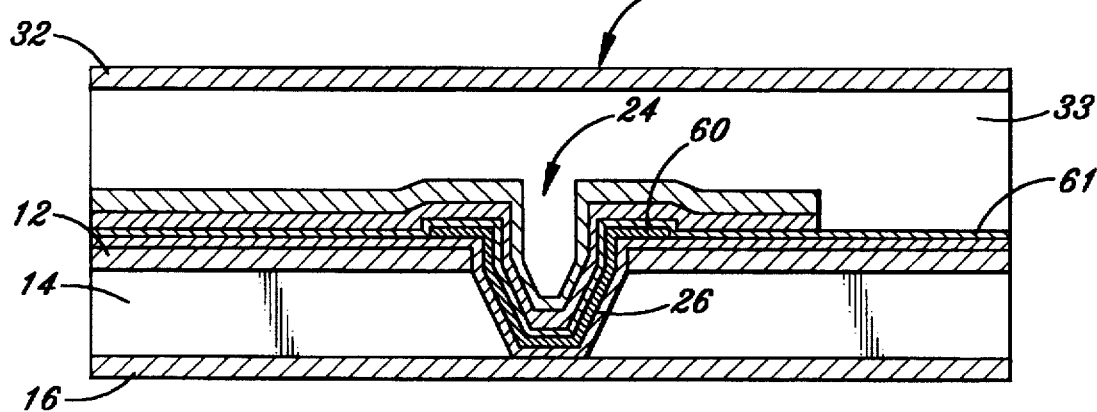
FIG. 8 illustrates a layer of a dielectric prepeg material and a "cap" layer laminated onto the base substrate.

As best seen by reference to FIG. 8, a layer of a dielectric prepreg material 33, and a "cap" layer of copper 32 is laminated onto the base substrate 10. The temperature, pressure, and time required for the lamination process should be as specified by the manufacturer of the particular dielectric prepeg used. During the lamination process, resin from the dielectric prepreg material 33 will flow into and fill the void space remaining in the well 24.

Figure 9:
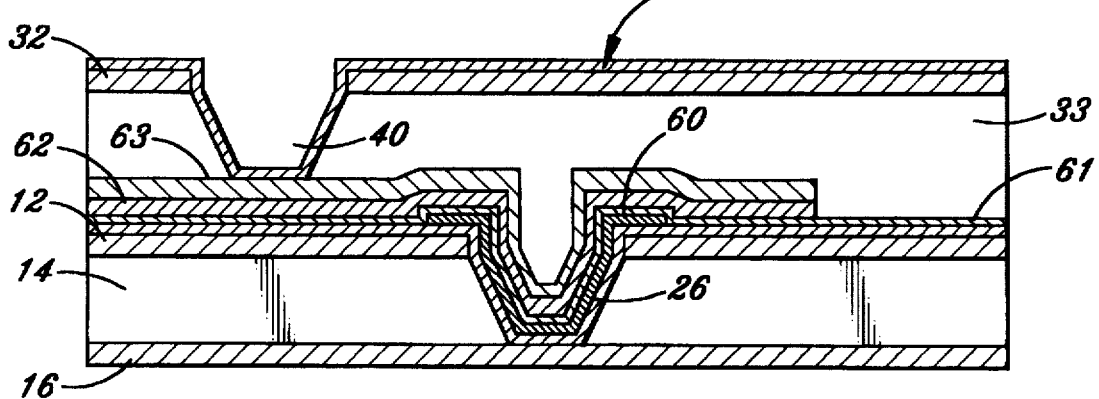
FIG. 9 illustrates a via which is formed to interconnect circuit layers of the base substrate.

FIG. 9 illustrates a via 40 which is formed to interconnect the top conductive layer 32 to the conductive layer 12. Via 40 is formed used the same process as described for the formation of the well 24, except that the deposition of the solder and thin sputtered copper is not necessary.

Figure 10:
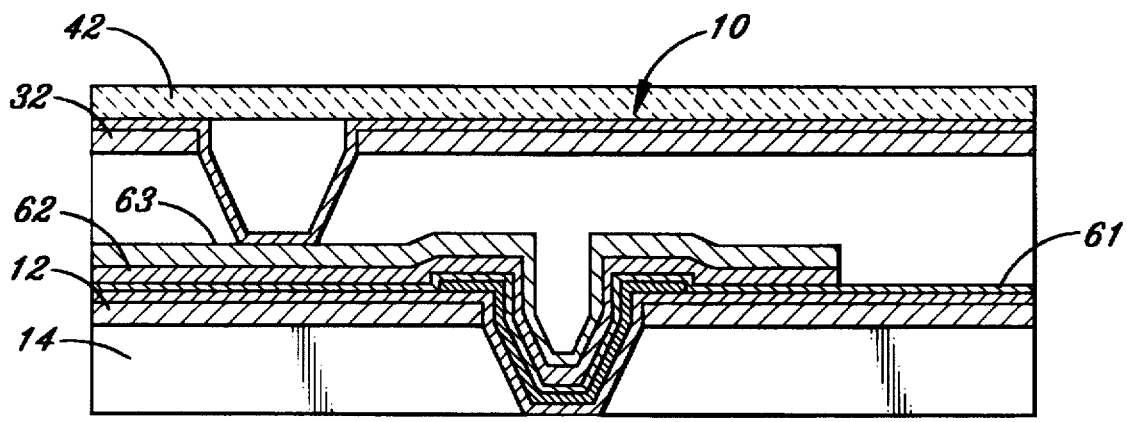
FIG. 10 illustrates the base substrate after the bottom conductive layer has been etched.

As best illustrated in FIG. 10, the top metal layer 32 of the base substrate is then coated with photoresist 42. Conductive layer 16 is then etched away using a suitable etchant. FIG. 10 illustrates base substrate 10 after the bottom conductive layer 16 has been etched. The photoresist 42 is then removed from conductive layer 32.

Figure 11:
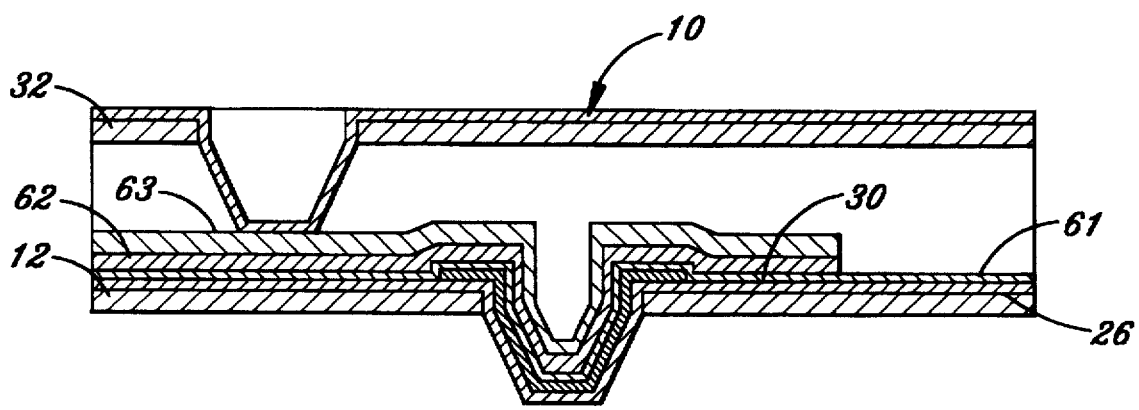
FIG. 11 depicts the base substrate after the dielectric material has been removed.

After the conductive layer 16 has been etched away, the now exposed dielectric material 14 is removed by any suitable process which will selectively remove dielectric from a conductor such as copper. Suitable processes include but are not limited to plasma etching, laser ablation reactive ion etching, or chemical etching. Care must be taken that all of the dielectric material 14 is removed from the conductive layer 12, as any remaining dielectric material 14 will prevent the conductive layer 12 from being etched away in subsequent process steps. FIG. 11 depicts the base substrate 10 after the dielectric material 14 has been removed.

Figure 12:
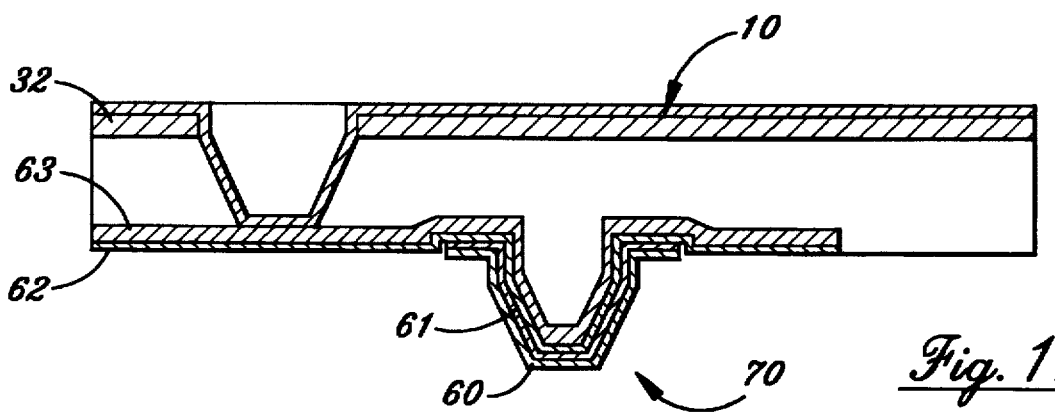
FIG. 12 illustrates a finished two-layer substrate with raised metallic contacts having a thin solder outer layer and a composite conductor metallurgy.

The top layer of the base substrate 10 is then coated with photoresist to protect it from the etchant which is used to remove the exposed conductive layer 12 and surface conductive layers 26 and 61. Any suitable etchant may be employed, however, the etchant must be capable of removing the conductive copper layers 12, 26 and 61, but not the solder layer 60 and the nickel layer 62. An alkaline copper etchant consisting of a copper ammonium complex, ammonium chloride, ammonium hydroxide, sodium chlorite, ammonium bicarbonate, ammonium phosphate, and ammonium nitrate, and commonly referred to as alkaline or ammoniacal etchant is particularly well suited. The photoresist may then be removed from the circuit and the solder reflowed. In this embodiment of the present invention, a copper/nickel metallurgy remains to form the interconnecting traces, with copper/nickel/thin copper/solder metallurgy for a bump 70. The nickel, bearing a native oxide, will act to prevent flow of the solder onto the traces during subsequent reflow and chip attach. FIG. 12 illustrates a finished circuit made in accordance with the teachings of one embodiment of the present invention.

As best seen with reference to FIGS. 1–12, the height of the bump 70 is determined by the thickness of the dielectric layer 14, minus the sum of the thickness of the copper layer 12 and the surface conductive copper layer 24. As the various conductive layers 12 and 24 may be made quite thin, the bump height is largely determined by the thickness of the dielectric layer 14. To maintain consistent height of the bumps across a large panel, one need only control the thickness of the dielectric layer 14. It is common that dielectrics available today offer thickness control of +/−10% or better, thus the planarity of the bumps created will approach +/−10%. The ability to control the bump height by controlling the thickness of the dielectric layer 14, and the degree of planarity achievable by this method is a significant improvement over the method of etching depressions in a mandrel, as described in U.S. Pat. No. 5,197,184.

As best seen with reference to FIGS. 13–18, in an alternative embodiment of the present invention, process steps are described which permit a base substrate 10, with raised metallic contacts 50, to be laminated and electrically connected to a multilayer circuit board.

Figure 13:
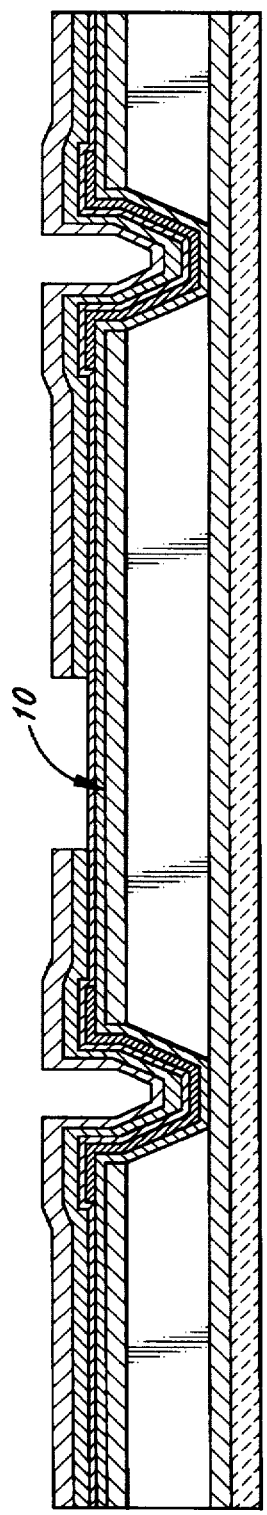
Figure 14:
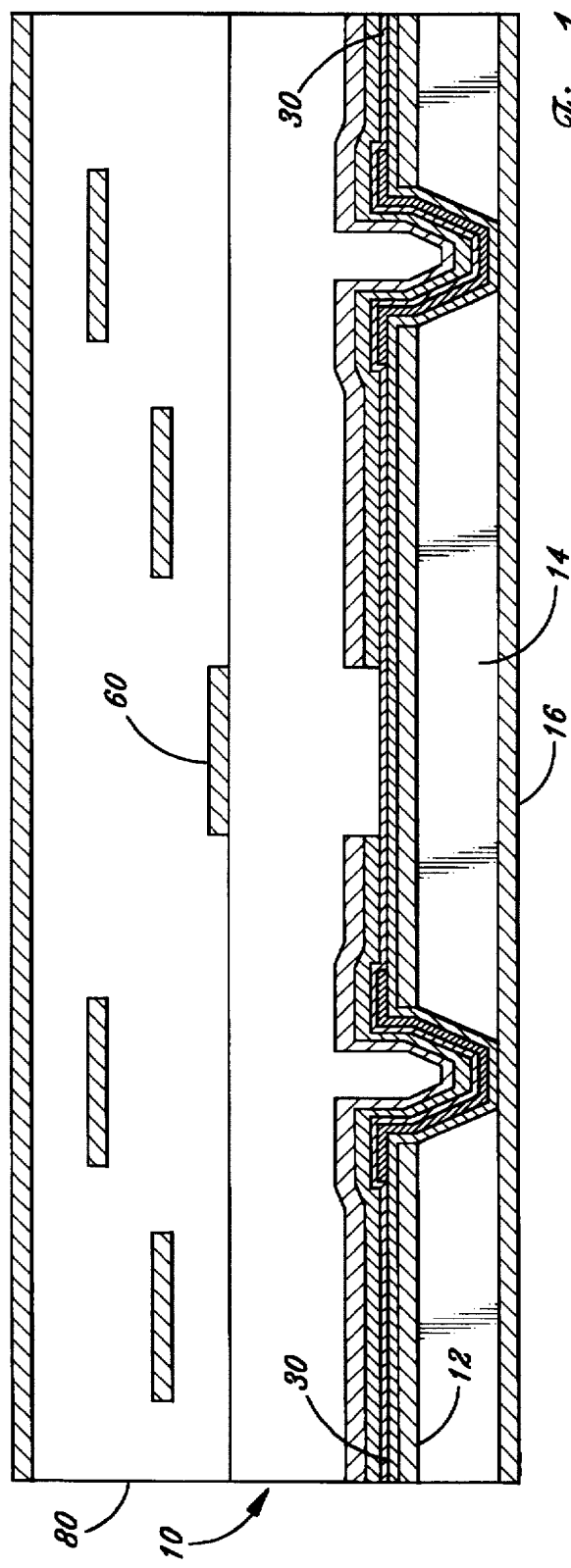

Turning to FIG. 13, the base substrate 10 is shown as made by the process steps which are described by FIGS. 1–7. The base substrate 10 is laminated to a multilayer circuit board 80 with a dielectric prepreg material, as best seen by reference to FIG. 14. The temperature, pressure, and time required for the lamination process should be as specified by the manufacturer of the particular dielectric prepreg used.

The multilayer circuit board may have any number of configurations. However, the side which is to be laminated to the base substrate 10 must have a series of pads 60 arranged such that vias 40 may later connect these pads to the base substrate 10, as best seen by sequentially viewing FIGS. 14–18. The opposite side of the multilayer circuit board may be finished prior to lamination, or may have only an unfinished copper layer, in which case this layer will be finished at the same time as the side with the raised contacts.

The top metal layer of the multi-layer circuit board 80 is then coated with photoresist to protect it from an etchant which is used to etch the conductive layer 16 from the base substrate 10. Any suitable etchant may be used. The photoresist is then removed from the multi-layer circuit board 80.

After the conductive layer 16 has been etched away, the now exposed dielectric material 14 is removed by any suitable process for removing a dielectric material from a conductor, such as copper, to thereby expose the raised metallic contacts 50, as best seen in FIG. 15. Such a suitable process may include, but is not limited to a plasma etching process, laser ablation, reactive ion etching, or chemical etching, for example. Care must be taken to remove all of the dielectric material from the conductive surface, as any remaining dielectric material will prevent the conductive material from being etched in subsequent process steps.

The top layer of the multi-layer circuit board 80 is then coated with photoresist to protect it from the etchant which is used to remove the exposed conductive layer 12. Any suitable etchant may be employed, however, the etchant must be capable of removing the conductive copper layers 12, 26 and 61, but not the solder layer 60 and the nickel layer 62. An alkaline copper etchant consisting of a copper ammonium complex, ammonium chloride, ammonium hydroxide, sodium chlorite, ammonium bicarbonate, ammonium phosphate, and ammonium nitrate, and commonly referred to as alkaline or ammoniacal etchant is particularly well suited. The photoresist may then be removed from the circuit and the solder reflowed. In this embodiment of the present invention, a copper/nickel metallurgy remains to form the interconnecting traces, with copper/nickel/thin copper/solder metallurgy for a bump 70. The nickel, bearing a native oxide, will act to prevent flow of the solder onto the traces during subsequent reflow and chip attach. FIG. 15 illustrates a finished circuit made in accordance with the teachings of the present invention.

Vias 40 are then drilled in the base substrate 10 for circuit interconnection. These vias may be either blind or through vias. The base substrate 10 is then processed in a conventional electroless copper plating operation such as is common in printed and flexible circuit manufacturing operations. The electroless copper deposits a layer of copper on the base substrate 10 and on the surface of the side walls of the vias. Additional electrolytically deposited copper may be added to thicken the deposit, and provide a more robust surface for additional process steps. FIG. 16 illustrates the base substrate 10 after such copper deposition. As may be appreciated by one skilled in the art, any suitable process which deposits a conductor may be used in place of the electroless copper process, such as but not limited to sputtering, evaporation, or deposition of a conductive coating which allows direct electrodeposition.

Figure 17:
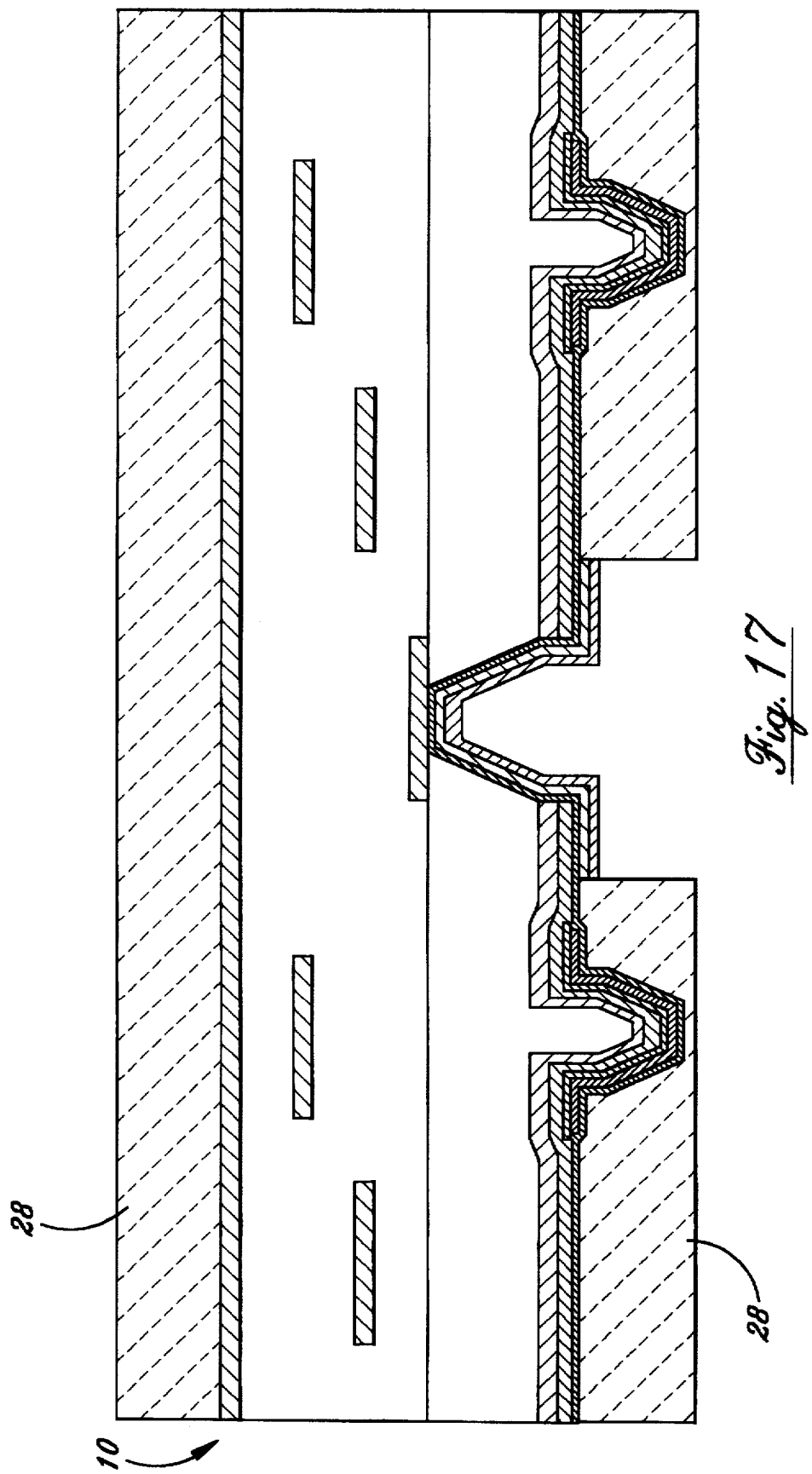

The base substrate is then coated with photoresist 28 on both sides, and the photoresist is processed to define patterns into which additional metal is deposited to form via and pad connections. Additional copper would likely be deposited. Also, a final etch resistant metal such as nickel, gold or solder may then be deposited. FIG. 17 illustrates a base substrate with the metals deposited as described herein-above. After deposition is complete, the photoresist 28 is removed from the base substrate.

Figure 18:
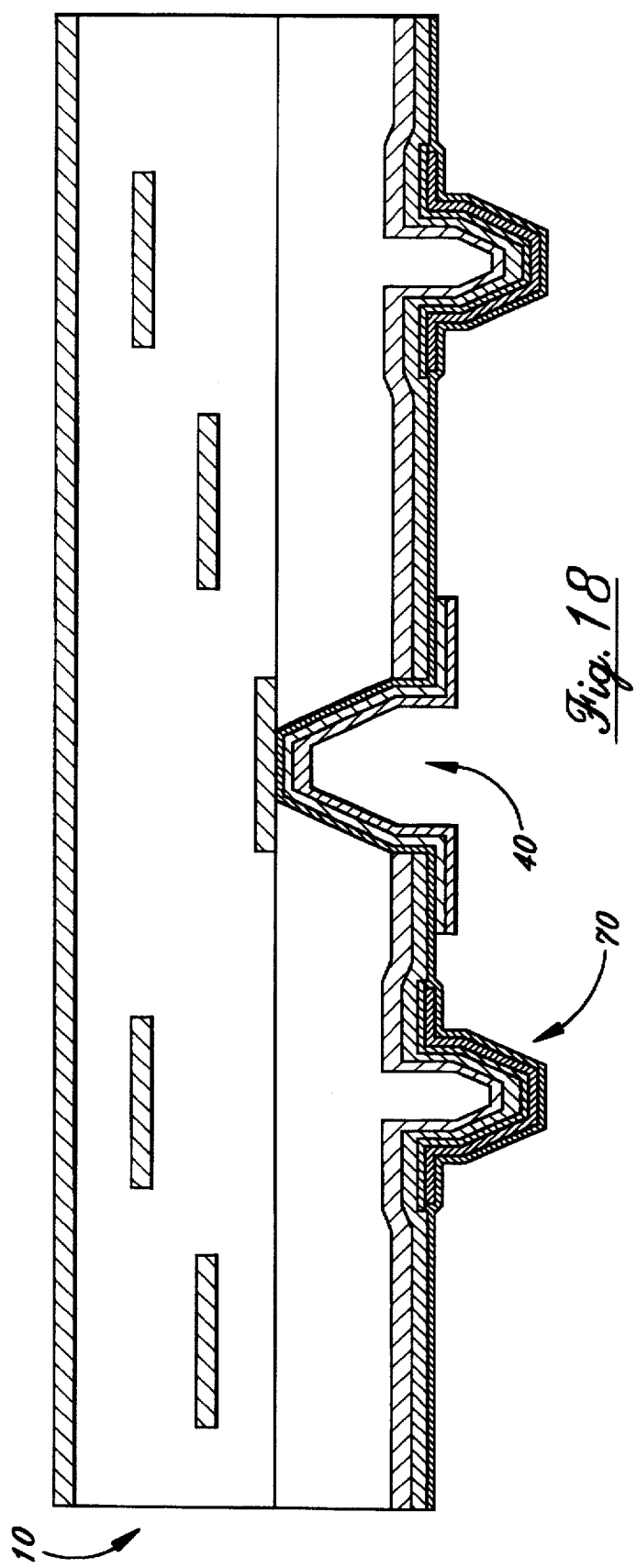

The base substrate 10 is then etched in a suitable copper etchant to remove the copper from the areas which were previously covered with photoresist. The circuit may then be routed from a panel. A completed substrate is shown in FIG. 18.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

Having described the invention, what is claimed is:

1. A method of forming at least one raised metallic contact on an electrical circuit, said method comprising the following steps:

providing a composite base substrate which is defined by at least a first conductive layer, a dielectric material and a second conductive layer;

removing a portion of the first conductive layer to expose the dielectric material;

removing said exposed portion of the dielectric material to the second conductive layer, thereby forming a depression;

depositing at least one layer of solder material on at least side wall portions of said depression;

depositing at least one layer of conductive material on said solder layer;

removing said second conductive layer; and completely removing said dielectric material to said first conductive layer thereby forming a raised metallic contact which extends perpendicularly away from said first conductive layer.

2. A method of forming at least one metallic contact on an electrical circuit, said method comprising the following steps:

providing a composite base substrate having opposed planar surfaces, the composite base substrate being defined by at least a first conductive layer, a first dielectric material and a second conductive layer;

removing a portion of the first conductive layer to expose the dielectric material;

removing said exposed portion of the dielectric material to the second conductive layer thereby forming a depression;

depositing at least one layer of solder material on at least side wall portions of said depression;

depositing at least one layer of conductive material on said solder layer;

laminating at least a second dielectric material to the first conductive layer of said composite base substrate;

removing said second conductive layer; and completely removing said first dielectric material to said first conductive layer thereby forming a raised metallic contact which extends perpendicularly away from said first conductive layer.

3. The method of claim 2 further including the step of depositing a third conductive layer on said second dielectric material.

4. The method of claim 3 further including the steps of:

removing a portion of the third conductive layer to expose a portion of said second dielectric material;

removing said exposed portion of said second dielectric material; and electrically connecting said third conductive layer to said first conductive layer.

5. A method of forming at least one raised metallic contact on an electrical circuit, said method comprising the following steps:

providing a composite base substrate which is defined by at least a first copper layer, a dielectric material and a second copper layer, removing a portion of the first copper layer to expose the dielectric material;

removing said exposed dielectric material to said second copper layer, thereby forming a depression;

depositing at least one layer of solder material on at least side wall portions of said depression;

depositing at least one conductive layer on said solder layer;

depositing at least one layer of a material on said conductive layer, wherein said material resists the flow of molten solder;

laminating at least a second dielectric material to the first copper layer of said composite base substrate;

removing said second copper layer; and completely removing said dielectric material to said first copper layer thereby forming a raised metallic contact which extends perpendicularly away from said first conductive layer.

6. The method of claim 5 further including, after the step of depositing said material on said conductive layer, the additional step of depositing copper on said material.

7. The method of claims 1, 2, or 5 further including the step of laminating the base substrate to a printed circuit board.

* * * * *